(12) United States Patent
Raza et al.

(10) Patent No.: US 8,370,543 B1
(45) Date of Patent: Feb. 5, 2013

(54) BUSY DETECTION LOGIC FOR ASYNCHRONOUS COMMUNICATION PORT

(75) Inventors: Syed Babar Raza, San Jose, CA (US); Pradeep Bajpai, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 64 days.

(21) Appl. No.: 13/154,348

(22) Filed: Jun. 6, 2011

Related U.S. Application Data

(63) Continuation of application No. 12/044,831, filed on Mar. 7, 2008, now Pat. No. 8,145,809.

(60) Provisional application No. 60/906,042, filed on Mar. 9, 2007, provisional application No. 60/934,664, filed on Jun. 14, 2007.

(51) Int. Cl.
*G06F 3/00* (2006.01)
*G06F 1/12* (2006.01)
*G06F 1/00* (2006.01)

(52) U.S. Cl. ............ 710/40; 710/8; 710/58; 713/400; 713/500

(58) Field of Classification Search .................. None
See application file for complete search history.

(56) References Cited

U.S. PATENT DOCUMENTS

| | | | |
|---|---|---|---|
| 4,899,352 A | 2/1990 | Cucchi et al. |
| 4,965,794 A | 10/1990 | Smith |
| 4,970,499 A | 11/1990 | Ryherd et al. |
| 5,166,926 A | 11/1992 | Cisneros et al. |
| 5,247,626 A | 9/1993 | Firoozmand |
| 5,289,432 A | 2/1994 | Dhong et al. |
| 5,384,734 A | 1/1995 | Tsujihashi et al. |
| 5,418,781 A | 5/1995 | Kaufman et al. |
| 5,424,995 A | 6/1995 | Miyazaki et al. |
| 5,428,574 A | 6/1995 | Kuo et al. |
| 5,434,818 A | 7/1995 | Byers et al. |
| 5,444,853 A | 8/1995 | Lentz |
| 5,502,833 A | 3/1996 | Byrn et al. |
| 5,586,294 A | 12/1996 | Goodwin et al. |
| 5,625,625 A | 4/1997 | Oskouy et al. |
| 5,638,506 A | 6/1997 | Peterson et al. |
| 5,649,230 A | 7/1997 | Lentz |
| 5,778,250 A | 7/1998 | Dye |
| 5,802,546 A | 9/1998 | Chisholm et al. |
| 5,804,986 A | 9/1998 | Jones |
| 5,805,808 A | 9/1998 | Hasani et al. |
| 5,812,820 A | 9/1998 | Loram |
| 5,815,501 A | 9/1998 | Gaddis et al. |
| 5,822,383 A | 10/1998 | Muntz et al. |
| 5,822,776 A | 10/1998 | De Korte et al. |
| 5,881,269 A | 3/1999 | Dobbelstein |
| 5,898,687 A | 4/1999 | Harriman et al. |
| 5,898,893 A | 4/1999 | Alfke |

(Continued)

FOREIGN PATENT DOCUMENTS

| | | |
|---|---|---|
| JP | 01285088 A1 | 11/1989 |
| WO | WO2004075447 A1 | 2/2004 |

OTHER PUBLICATIONS

U.S. Appl. No. 12/044,831, filed Mar. 7, 2008, the parent application of this continuation application.

(Continued)

*Primary Examiner* — Alan Chen

(57) ABSTRACT

An embodiment of the present invention is directed to a system for synchronizing independent time domain information. The synchronization of the device resource access information allows a memory access device to reliably access memory in a time domain independent of a device issuing requests. The system may synchronize device resource information for requests made by a processor to access (e.g., read/write) locations of a memory device. The present invention synchronizes the device access information without restricting pulse width of a read/write signal or requiring a high speed clock.

20 Claims, 5 Drawing Sheets

U.S. PATENT DOCUMENTS

| | | | |
|---|---|---|---|
| 5,912,898 | A | 6/1999 | Khoury |
| 5,914,757 | A | 6/1999 | Dean et al. |
| 5,963,499 | A | 10/1999 | Leong et al. |
| 5,970,229 | A | 10/1999 | Thomas et al. |
| 5,991,295 | A | 11/1999 | Tout et al. |
| 6,005,795 | A | 12/1999 | Hawkins et al. |
| 6,005,796 | A | 12/1999 | Sywyk et al. |
| 6,047,339 | A | 4/2000 | Su et al. |
| 6,049,487 | A | 4/2000 | Plants et al. |
| 6,055,607 | A * | 4/2000 | Bauman et al. ............... 711/138 |
| 6,072,715 | A | 6/2000 | Holloway |
| 6,104,802 | A | 8/2000 | Perlmutter |
| 6,115,379 | A | 9/2000 | Flanders et al. |
| 6,131,123 | A | 10/2000 | Hurst et al. |
| 6,163,810 | A | 12/2000 | Bhagavath et al. |
| 6,163,842 | A | 12/2000 | Barton |
| 6,181,595 | B1 | 1/2001 | Hawkins et al. |
| 6,181,634 | B1 | 1/2001 | Okita |
| 6,212,597 | B1 | 4/2001 | Conlin et al. |
| 6,246,682 | B1 | 6/2001 | Roy et al. |
| 6,246,692 | B1 | 6/2001 | Dai et al. |
| 6,262,912 | B1 | 7/2001 | Sywyk et al. |
| 6,269,413 | B1 | 7/2001 | Sherlock |
| 6,292,877 | B1 | 9/2001 | Ryan |
| 6,295,295 | B1 | 9/2001 | Wicklund |
| 6,304,936 | B1 | 10/2001 | Sherlock |
| 6,339,596 | B1 | 1/2002 | Kozaki et al. |
| 6,363,077 | B1 | 3/2002 | Wong et al. |
| 6,421,770 | B1 | 7/2002 | Huch et al. |
| 6,425,045 | B2 | 7/2002 | LaBerge |
| 6,430,088 | B1 | 8/2002 | Plants et al. |
| 6,430,626 | B1 | 8/2002 | Witkowski et al. |
| 6,504,204 | B1 | 1/2003 | Hsu et al. |
| 6,515,991 | B1 | 2/2003 | Mckeown |
| 6,545,935 | B1 | 4/2003 | Hsu et al. |
| 6,560,668 | B2 | 5/2003 | Ryan et al. |
| 6,578,118 | B1 | 6/2003 | Raza et al. |
| 6,581,144 | B1 | 6/2003 | Raza et al. |
| 6,615,304 | B1 | 9/2003 | Ishizuka |
| 6,631,455 | B1 | 10/2003 | Raza et al. |
| 6,731,566 | B1 | 5/2004 | Sywyk et al. |
| 6,760,327 | B1 | 7/2004 | Manchester et al. |
| 6,816,955 | B1 | 11/2004 | Raza et al. |
| 6,822,960 | B1 | 11/2004 | Manchester et al. |
| 6,834,378 | B2 | 12/2004 | Augsburg et al. |
| 6,907,479 | B2 | 6/2005 | Karnstedt et al. |
| 6,934,289 | B2 | 8/2005 | Lee |
| 7,016,349 | B1 | 3/2006 | Raza et al. |
| 7,193,994 | B1 | 3/2007 | Payson |
| 7,242,686 | B1 | 7/2007 | Dougherty et al. |
| 7,284,074 | B2 | 10/2007 | Lee et al. |
| 2001/0014053 | A1 | 8/2001 | Li |
| 2001/0044882 | A1 | 11/2001 | Pille et al. |
| 2002/0010897 | A1 | 1/2002 | Stark |
| 2002/0057893 | A1 | 5/2002 | Wood et al. |
| 2002/0091916 | A1 | 7/2002 | Dowling |
| 2004/0039938 | A1 | 2/2004 | Katz et al. |

OTHER PUBLICATIONS

USPTO Notice of Allowance for U.S. Appl. No. 12/044,831 dated Jan. 24, 2012; 5 pages.
USPTO Notice of Allowance for U.S. Appl. No. 12/044,831 dated Jan. 9, 2012; 7 pages.
USPTO Non-Final Rejection for U.S. Appl. No. 12/044,831 dated Sep. 19, 2011; 5 pages.
USPTO Notice of Allowance for U.S. Appl. No. 12/044,831 dated Dec. 3, 2010; 7 pages.
USPTO Notice of Allowance for U.S. Appl. No. 12/044,831 dated Jul. 13, 2010; 6 pages.
USPTO Non-Final Rejection for U.S. Appl. No. 12/044,831 dated Feb. 2, 2010; 6 pages.
Feipei Lai et al., "A New Design Methodology for Multiport SRAM Cell", IEEE Transactions on Circuits and Systems I: Fundamentals Theory and Applications No. 11 (Nov. 1994) pp. 677-685.
USPTO Advisory Action for U.S. Appl. No. 08/789,300 dated Apr. 15, 1998.
USPTO Final Rejection for U.S. Appl. No. 08/789,299 dated Oct. 28, 1997.
USPTO Final Rejection for U.S. Appl. No. 08/789,300 dated Oct. 28, 1997.
USPTO Final Rejection for U.S. Appl. No. 09/876,429 dated Mar. 18, 2003.
USPTO Final Rejection for U.S. Appl. No. 09/876,429 dated May 13, 2002.
USPTO Non-Final Rejection for U.S. Appl. No. 08/789,299 dated May 7, 1997.
USPTO Non-Final Rejection for U.S. Appl. No. 08/789,300 dated May 5, 1997.
USPTO Non-Final Rejection for U.S. Appl. No. 08/789,300 dated Aug. 7, 1998.
USPTO Non-Final Rejection for U.S. Appl. No. 08/789,300 dated Dec. 22, 1998.
USPTO Non-Final Rejection for U.S. Appl. No. 09/443,062 dated Oct. 24, 2000.
USPTO Non-Final Rejection for U.S. Appl. No. 09/676,169 dated Jun 4, 2003; 7 pages.
USPTO Non-Final Rejection for U.S. Appl. No. 09/876,429 dated Jul. 30, 2003.
USPTO Non-Final Rejection for U.S. Appl. No. 09/876,429 dated Nov. 8, 2002.
USPTO Non-Final Rejection for U.S. Appl. No. 09/876,429 dated Dec. 3, 2001.
USPTO Non-Final Rejection for U.S. Appl. No. 10/773,948 dated Jul. 31, 2007; 7 pages.
USPTO Non-Final Rejection for U.S. Appl. No. 09/443,126 dated Mar. 14, 2000.
USPTO Notice of Allowance for U.S. Appl. No. 08/789,299 dated Aug. 13, 1999.
USPTO Notice of Allowance for U.S. Appl. No. 08/789,300 dated Aug. 13, 1999.
USPTO Notice of Allowance for U.S. Appl. No. 09/443,062 dated Feb. 16, 2001.
USPTO Notice of allowance for U.S. Appl. No. 09/443,126 dated Jul. 26, 2000.
USPTO Notice of Allowance for U.S. Appl. No. 09/676,169 dated Jul. 14, 2004; 4 pages.
USPTO Notice of Allowance for U.S. Appl. No. 09/676,170 dated Dec. 13, 2002; 5 pages.
USPTO Notice of Allowance for U.S. Appl. No. 09/676,171 dated Dec. 6, 2002; 4 pages.
USPTO Notice of Allowance for U.S. Appl. No. 09/676,704 dated Mar. 9, 2005; 8 pages.
USPTO Notice of Allowance for U.S. Appl. No. 09/676,705 dated May 2, 2003; 5 pages.
USPTO Notice of Allowance for U.S. Appl. No. 09/676,706 dated Oct. 19, 2005; 6 pages.
USPTO Notice of Allowance for U.S. Appl. No. 09/876,429 dated Nov. 21, 2003.
USPTO Notice of Allowance for U.S. Appl. No. 10/746,349 dated Dec. 21, 2010; 7 pages.
USPTO Notice of Allowance for U.S. Appl. No. 10/773,948 dated Feb. 25, 2009; 6 pages.
USPTO Notice of Allowance for U.S. Appl. No. 10/773,948 dated Jun. 26, 2009; 6 pages.
USPTO Notice of Allowance for U.S. Appl. No. 10/773,948 dated Jul. 23, 2008; 8 pages.
USPTO Reply Brief for U.S. Appl. No. 09/676,704 dated Dec. 23, 2003; 2 pages.
USPTO Advisory Action for U.S. Appl. No. 08/789,299 dated Apr. 1, 1998.
Helmut Liedl and Kurt Marquardt, "Dual-Port RAM for Cost-attractive Multi-Microcontroller Systems," Siemens Components XXV No. 5 (Oct. 1990) pp. 163-166.
"A Comprehensive Dictionary of Electrical Engineering," Editor-in-Chief: Phillip A. Laplante; 1999, CRC Press; 3 pages.
"Algorithm for Managing Multiple First-In, First-Out Queues from a Single Share Random-Access Memory," IBM Technical Disclosure Bulletin, Aug. 1989; 5 pages.

USPTO Non-Final Rejection for U.S. Appl. No. 09/676,169 dated Jul. 25, 2002; 6 pages.
Feipei Lai et al., "A New Design Methodology for Multiport SRAM Cell", IEEE Transactions on Cicuits and Systems I: Fundamentals Theory and Applications No. 11 (Nov. 1994) pp. 677-685.
Julie K. Peterson, "The Telecommunications Illustrated Dictionary," Second Edition, 2002, CRC Press; 3 pages.
Merriam Webster Online Dictionary "Seperate," retrieved on Feb. 10, 2004; 1 page.
Ukitae et al., "A Single-Bit-Line Cross-Point Cell Activation (SCPA) Architecture for Utlra-Low-Power SRAMs," IEEE Journal of Solid State Circuits, vol. 38, No. 11, Nov. 1993, pp. 1114-1118.
USPTO Non-Final Rejection for U.S. Appl. No. 10/773,948 dated Jan. 14, 2008; 7 pages.
USPTO Advisory Action for U.S. Appl. No. 09/676,169 dated Jan. 15, 2004; 1 page.
USPTO Advisory Action for U.S. Appl. No. 09/676,169 dated Mar. 6, 2003; 5 pages.
USPTO Advisory Action for U.S. Appl. No. 09/676,169 dated Dec. 11, 2003; 2 pages.
USPTO Advisory Action for U.S. Appl. No. 09/676,704 dated Jun. 13, 2003; 2 pages.
USPTO Advisory Action for U.S. Appl. No. 09/676,704 dated Jul. 25, 2003; 1 page.
USPTO Advisory Action for U.S. Appl. No. 09/676,706 dated Aug. 10, 2005; 2 pages.
USPTO Advisory Action for U.S. Appl. No. 09/876,429 dated Sep. 18, 2002.
USPTO Advisory Action for U.S. Appl. No. 10/746,349 dated May 21, 2010; 2 pages.
USPTO U.S. Appl. No. 12/044,862: "Arbitration Method for Programmable Multiple Clock Domain Bi-Directional Interface," Gupta et al., filed Mar. 7, 2008; 33 pages.
USPTO Non-Final Rejection for U.S. Appl. No. 10/746,349 dated Sep. 17, 2009; 8 pages.
USPTO Non-Final Rejection for U.S. Appl. No. 10/746,349 dated Aug. 2, 2010; 7 pages.
USPTO Final Rejection for U.S. Appl. No. 09/676,169 dated Sep. 24, 2003; 8 pages.
USPTO Final Rejection for U.S. Appl. No. 09/676,169 dated Dec. 18, 2002; 10 pages.
USPTO Final Rejection for U.S. Appl. No. 09/676,704 dated Apr. 14, 2003; 9 pages.
USPTO Final Rejection for U.S. Appl. No. 09/676,706 dated Jun. 1, 2005; 7 pages.
USPTO Non-Final Rejection for U.S. Appl. No. 09/676,706 dated Sep. 22, 2004; 7 pages.
USPTO Non-Final Rejection for U.S. Appl. No. 09/676,705 dated Nov. 13, 2002; 65 pages.
USPTO Final Rejection for U.S. Appl. No. 10/746,349 dated Feb. 18, 2010; 10 pages.
USPTO Final Rejection for U.S. Appl. No. 10/746,349 dated Jun. 8, 2009; 11 pages.
USPTO Non-Final Rejection for U.S. Appl. No. 09/676,704 dated Nov. 5, 2002; 6 pages.
USPTO Non-Final Rejection for U.S. Appl. No. 09/676,171 dated Jun. 18, 2002; 16 pages.
USPTO Non-Final Rejection for U.S. Appl. No. 09/676,170 dated Aug. 15, 2002; 25 pages.

* cited by examiner

100

110

BUSY DETECTION LOGIC FOR ASYNCHRONOUS COMMUNICATION PORT

RELATED U.S. APPLICATIONS

This application is a continuation of U.S. application Ser. No. 12/044,831 filed Mar. 7, 2008, now U.S. Pat. No. 8,145,809 which claims the benefit of and priority to U.S. Provisional Application No. 60/906,042, filed Mar. 9, 2007, and to U.S. Provisional Application No. 60/934,664, filed Jun. 14, 2007, each of which are hereby incorporated by reference in their entirety.

This application claims the benefit of and priority to provisional patent application, Ser. No. 60/906,042, entitled "Implementation of Logical End-Points in USB Device," with filing date Mar. 9, 2007, and hereby incorporated by reference in its entirety.

This application claims the benefit of and priority to the provisional patent application, Ser. No. 60/934,664, entitled "Busy Detection Logic for Asynchronous Communication Port," with filing date Jun. 14, 2007, and hereby incorporated by reference in its entirety.

FIELD OF INVENTION

Embodiments of the present invention relate to communication synchronization.

BACKGROUND OF THE INVENTION

Clock synchronization devices attempt to synchronize communication between two devices in different or independent clock domains or time domains. For example, the communication between a processor in a fast clock domain and a memory device in a slow clock domain may require synchronization in order for the devices to communicate (e.g., for the processor to access data stored in the memory device). Memory access synchronization may require that the memory be aware of which address or resource is being accessed by a processor.

FIGS. 1A and 1B show conventional designs for synchronizing access information. Specifically, FIG. 1A shows a conventional system 100 with an arrangement of flip-flops 104 and 106 for synchronizing information between time domains with a core or slow clock 108. The asynchronous read/write enable signal 102 is synchronized via the core clock 108 or slower clock. This design requires that the pulse width of the clock signal has to be larger than the clock period or the clock signal that samples it. For example, if the core is running at 100 Mhz, the clock period will be 10 ns and the read/write strobe is required to be greater than 10 ns. Otherwise, if the width of the read/write strobe was less than 10 ns (e.g., 5 ns) the read/write strobe can change during the clock period and the core clock will not see the change. Thus, a restriction is placed on the pulse width so that it is larger than the clock period of the clock being used to sample.

FIG. 1B shows another conventional system 110 with an arrangement of flip-flops 114, 116 and 117 for synchronizing information between time domains via a fast clock 118 and core clock 120. The fast clock is used to remove the restriction placed on the pulse width of the previous conventional design by using the fast clock to sample frequently enough that a greater range of pulse widths are supported. For example, if the core is operating at 100 Mhz and the fast clock runs at 1 Ghz, the samples will be every 1 ns and thus the pulse width can be one to two ns. Unfortunately, a high speed clock increases the physical complexity of this circuit and requires more power and is more complex to design, expensive, etc.

Thus, conventional synchronization designs have unfortunate pulse width restrictions or increased complexity and power requirements.

SUMMARY OF THE INVENTION

Accordingly, embodiments of the present invention are directed to a system and method for synchronizing device resource access information between independent time domains. The synchronization of the device resource access information allows a memory access device to reliably access memory in a time domain independent of the device issuing access requests. Embodiments of the present invention synchronize the device access information without restricting the pulse width of a read/write signal or requiring a high speed clock.

More specifically, an embodiment of the present invention is directed to a system for synchronizing independent time domain information including trigger logic for determining port busy information coupled to a read/write signal, synchronization logic for synchronizing the port busy information with a different time domain coupled to the trigger logic, load logic for ensuring that only one port is reported as busy at a time coupled to the synchronization logic, and clear request logic for clearing port busy information coupled to the trigger logic, the synchronization logic, and the load logic. The system may synchronize device resource information for requests made by a processor to access (e.g., read/write) locations of a memory device.

Another embodiment of the present invention is directed to a method for communicating device resource access information between independent time domains including receiving a request for access to one of a plurality of resources of a device, determining which device resource is to be accessed, synchronizing device resource information to another independent time domain, transmitting device resource information to a system for accessing the device resource, and clearing device resource information after the device resource has been accessed.

Another embodiment of the present invention is a system including a processor for performing computing operations, a memory device for storing data coupled to a memory access synchronizer, the memory access synchronizer for facilitating memory access between the processor and the memory device, a memory interface logic unit for forwarding memory access requests coupled to the processor and the memory access synchronizer, and a busy detection logic unit for synchronizing and providing resource information to the memory access synchronizer coupled to the memory interface logic.

DESCRIPTION OF THE INVENTION

Reference will now be made in detail to the preferred embodiments of the claimed subject matter, examples of which are illustrated in the accompanying drawings. While the invention will be described in conjunction with the preferred embodiments, it will be understood that they are not intended to limit the claimed subject matter to these embodiments. On the contrary, the claimed subject matter is intended to cover alternatives, modifications and equivalents, which may be included within the spirit and scope of the claimed subject matter as defined by the claims. Furthermore, in the detailed description of the present invention, numerous specific details are set forth in order to provide a thorough understanding of the claimed subject matter. However, it will be obvious to one of ordinary skill in the art that the claimed subject matter may be practiced without these specific details. In other instances, well known methods, procedures, components, and circuits have not been described in detail as not to unnecessarily obscure aspects of the claimed subject matter.

EXAMPLE SYSTEM

Figure 1A:
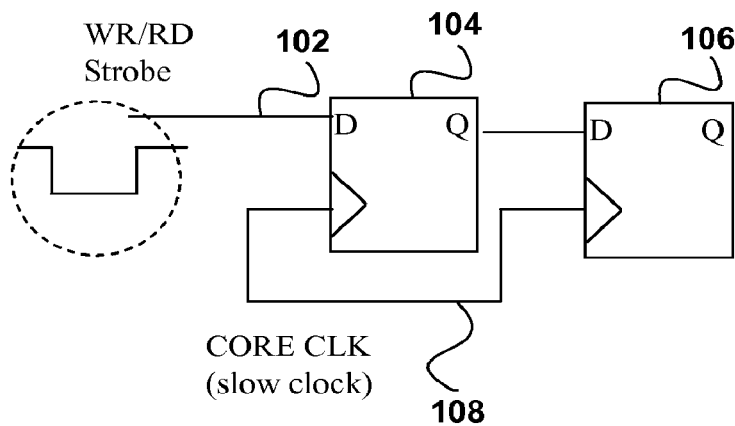
FIGS. 1A-1B show block diagrams of a conventional synchronization designs.
Figure 1B:
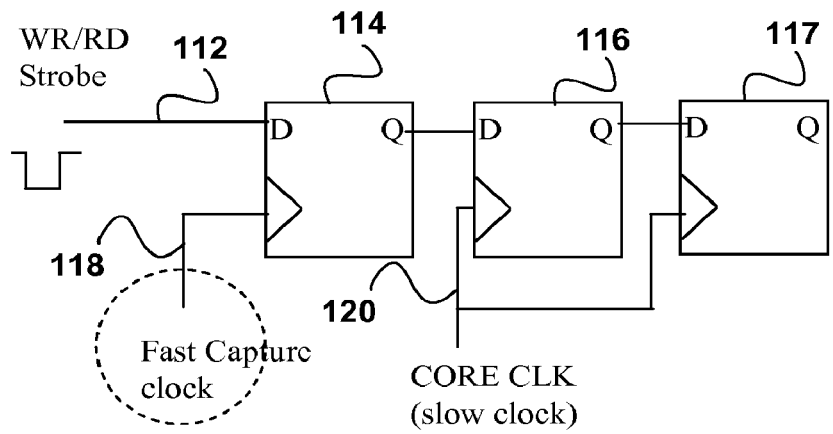
Figure 2:
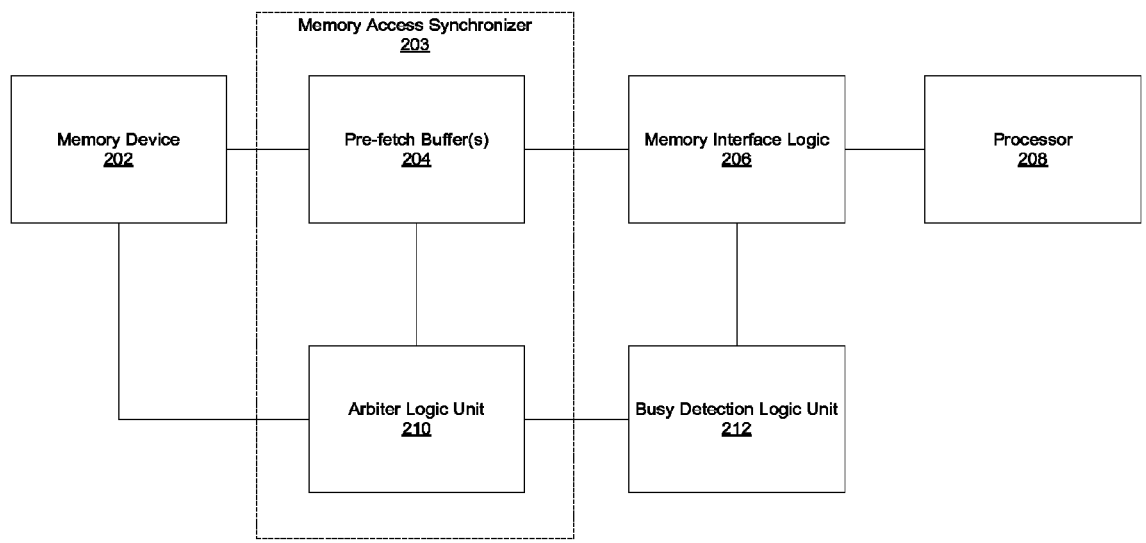
FIG. 2 shows an exemplary system for synchronizing communication, in accordance with one embodiment of the present invention.
Figure 3:
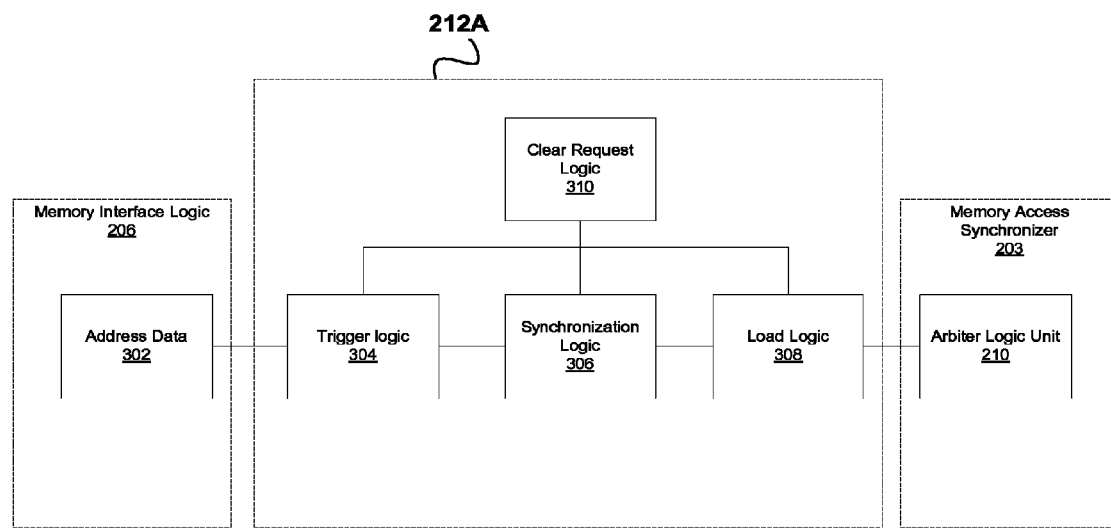
FIG. 3 shows a block diagram of busy detection logic, in accordance with another embodiment of the present invention.
Figure 4:
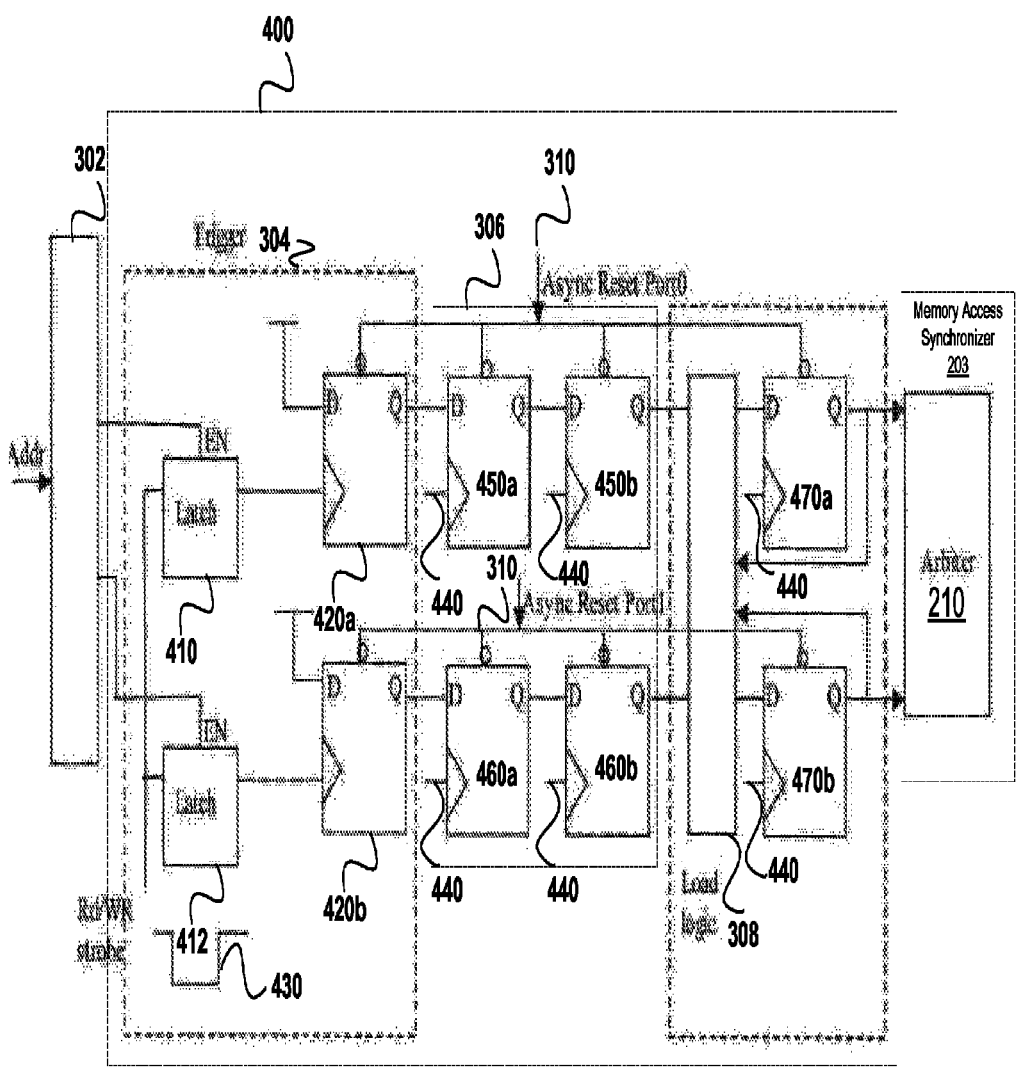
FIG. 4 shows another block diagram of busy detection logic, in accordance with an embodiment of the present invention.

FIGS. 2-4 illustrate example components used by various embodiments of the present invention. Although specific components are disclosed in systems 200, 212A and 400 it should be appreciated that such components are examples. That is, embodiments of the present invention are well suited to having various other components or variations of the components recited in systems 200, 212A and 400. It is appreciated that the components in systems 200, 212A and 400 may operate with other components than those presented, and that not all of the components of systems 200, 212A and 400 may be required to achieve the goals of systems 200, 212A and 400.

System 200 includes memory device 202, memory interface logic 206, busy detection logic unit 212, processor 208, and memory access synchronizer 203 which may include pre-fetch buffer(s) 204 and arbiter logic unit 210. As previously indicated, the present application is related to patent application Ser. No. 12/044,862, filed Mar. 7, 2008 and titled "Arbitration method for programmable multiple clock domain bi-directional interface," by Gupta et al., which is incorporated herein by reference for all purposes.

Processor 208 may make requests to access data (e.g., read or write) in memory device 202. In one embodiment, processor 208 and memory device 202 are synchronized to independent or different clocks or time domains. It is appreciated that processor 208 and memory device 202 could be replaced with any logic circuits or devices in different time domains and embodiments of the present invention would facilitate communication without additional latency or synchronization uncertainty.

Memory interface logic unit 206 receives requests from processor 208 to access (e.g., read/write) resources or locations on memory device 202. In one embodiment, a request from processor 208 may include a read/write signal, a memory address, read/write data, a chip enable signal, and an output enable signal. Memory interface logic 206 forwards data and control information to memory access synchronizer 203.

Memory access synchronizer 203 synchronizes the performance of memory accesses between processor 208 and memory device 202 which reside in independent time domains. In one embodiment, memory access synchronizer 203 includes pre-fetch buffer(s) 204 and arbiter logic unit 210. Arbiter logic 210 coordinates synchronization of memory accesses via pre-fetch buffer(s) 204. Arbiter logic 210 further ensures that pre-fetch buffer(s) 204 do not overflow and lose write data or become empty and interrupt the data flow to processor 208.

Busy Detection Logic Unit 212 provides memory assess synchronizer 203 with information on the current resources requested by processor 208, based on information provided by memory interface logic 206, in a synchronized manner. Busy detection logic unit 212 synchronizes requests from processor 208 with the core clock or clock of memory device 202. For example, busy detection logic 212 may signal memory access synchronizer 203 that processor 208 is requesting access to a memory location in memory device 202.

FIG. 3 shows a system 212A for synchronizing independent time domain information. System 212A includes trigger logic 304, synchronization logic 306, load logic 308, and clear request logic 310.

Trigger logic 304 determines for which port or resource the processor is requesting access. In one embodiment, trigger logic 304 uses a read/write strobe signal as a clock and based on the address data 302 provided by memory interface logic 206, determines which port or resource information needs to be set as busy. For example, when a read/write signal clocks trigger logic 304, if the address provided corresponds to a first resource or memory location then information will be set accordingly which is used to inform memory access synchronizer 203 that the resource or memory location is busy. In one embodiment, trigger logic 304 is clocked based on the rising/falling edge of the read(adv)/write(WE) signal, which allows port or resource requests to be recorded without pulse width requirements or high speed clocks. For example, when the rising edge of the read/write signal and an address are received, trigger logic 304 will set a data element corresponding or qualified by the port or resource that the processor is requesting.

Synchronization logic 306 receives resource information from trigger logic 304 and synchronizes the information with the receiving core or memory clock domain. In one embodiment, synchronization logic 306 operates in the core or memory clock domain. After synchronizing the resource information with the core or memory clock domain, the resource information is provided to load logic 308.

Load logic 308 provides resource information to memory access synchronizer 203 so that memory access synchronizer 203 is aware of which resource or memory location a device (e.g., processor 208) is accessing. In one embodiment, load logic 308 provides the resource information to arbiter logic unit 210 of memory access synchronizer 203. Arbiter logic unit 210 may then use the resource information to service (e.g., load or pull data) from a plurality of pre-fetch buffers. Load logic 308 ensures that memory access synchronizer 203 sees only one busy port or resource at one time and that subsequent busy port or resource information is loaded, presented or sent to memory access synchronizer 203 only after the request on the previous busy port or resource request is handled or completed and cleared. Load logic 308 thus allows a one hot port busy setting. In other embodiment, load logic can be any priority other than one hot setting.

Clear request logic 310 generates a reset signal to clear requests or busy port or resource information from system 212A after a request has been performed. In one embodiment, clear request logic 310 may generate an asynchronous reset signal in the core clock domain to clear currently serviced resource information from trigger logic 304, synchronization logic 306, and load logic 308 after the request from processor (e.g., processor 208) has been serviced. In another embodiment, clear request logic generates a clear signal based on a signal generated by a processor after completing a request. For example, when a processor has finished reading a USB end point, the processor may generate a finished signal which is used by the clear request logic 310 to clear the endpoint busy information.

FIG. 4 shows a block diagram of busy detection logic, in accordance with an embodiment of the present invention. System 400 includes trigger logic 304, synchronization logic 306, load logic 308, and reset signal 310.

As described herein, trigger logic 304 receives address information from address source 302 and use a read/write signal as a clock. In one embodiment, trigger logic 304 includes a plurality of latches 410, 412 and corresponding D flip-flops 420a-b. Each pair of latch and D flip-flop may correspond to a resource (e.g., port) or memory location. The enable lines of the latches may be coupled to an address line and the clock coupled to a read/write signal 430. The clocks of the D flip-flops 420 may connected to the output of the latches and the data connection of the D flip-flops 420 may be connected to high. The clear of the D flip-flops 420 may be connected to reset signal 310. When an address is received by trigger logic 304 and the read/write signal rising edge is detected, the latch corresponding to the address will be enabled and will clock the corresponding D flip-flop. The D flip-flop then is set and represents that the processor is accessing the resource with the address received which is provided to the synchronization logic 306.

As described herein, synchronization logic 306 receives resource information and synchronizes the information with the core or memory clock domain. Synchronization logic 306 may include a plurality of D flip-flops 450a-b, 460a-b which are clocked by the core or memory clock 440 domain. The clear connector of the D flip-flops 450a-b, 460a-b may be connected to clear signal 310. Synchronization logic 306 then provides the resource information to load logic 308.

As described herein, load logic 308 provides resource information to memory access synchronizer 203 and ensures that memory access synchronizer 203 only sees a single resource busy or in use at a single time. In one embodiment, load logic 308 provides resource information via D flip-flops 470a-b which are clocked by core clock 440 to an arbiter logic unit 210 of memory access synchronizer 203.

As described herein, after the resource described by the resource information has been accessed (e.g., read/write), clear signal 310 clears resource information from trigger logic 304, synchronization logic 306, and load logic 308. Clear signal 310 may be connected to the clear connector of D flip-flops of trigger logic 304, synchronization logic 306, and load logic 308. In one embodiment, clear signal 310 may be sent to trigger logic 304, synchronization logic 306, and load logic 308 when a processor has signaled access to a resource has been completed.

EXAMPLE OPERATIONS

Figure 5:
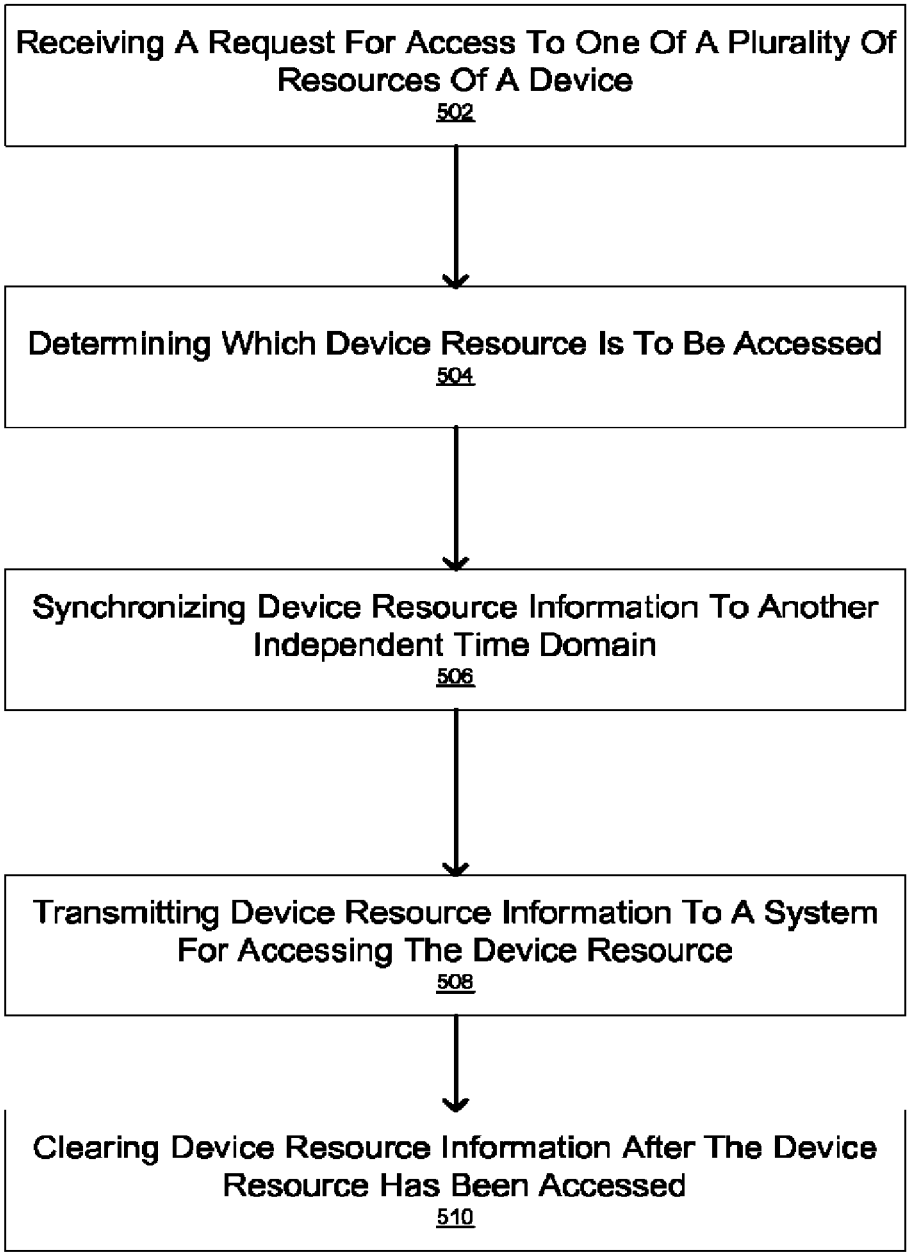
FIG. 5 shows a process for communicating device resource access information between independent time domains, in accordance with an embodiment of the present invention.

With reference to FIG. 5, exemplary flowchart 500 each illustrates example blocks used by various embodiments of the present invention. Flowchart 500 includes processes that, in various embodiments, are carried out by a processor under the control of computer-readable and computer-executable instructions. Although specific blocks are disclosed in flowcharts 500, such blocks are examples. That is, embodiments are well suited to performing various other blocks or variations of the blocks recited in flowchart 500. It is appreciated that the blocks in flowchart 500 may be performed in an order different than presented, and that not all of the blocks in flowchart 500 may be performed.

FIG. 5 is a flowchart 500 of an exemplary process for communicating device resource access information between independent time domains. In one embodiment, the blocks of flowchart 500 are performed on a system that communicates via USB and the device resources are USB endpoints.

At block 502, a request to access one of a plurality of resources of a device is received. As described herein, a processor may make a request to access a device resource (e.g., port or memory location) of a device in another independent time domain.

At block 504, which device resource is to be accessed is determined. As described herein, address information may be used to determine which device resource is to be accessed and the corresponding device resource information is stored.

At block 506, device resource information is synchronized to another independent time domain. As described herein, the device resource information is synchronized to the time domain of the other device (e.g., memory device) and the resource information is passed to a system for performing access operations on the device.

At block 508, device resource information is transmitted to a system for accessing the device resources. As described herein, device resource information may be provided to a memory access synchronizer for performing and coordinating access (e.g., read or write) operations to a memory device.

At block 510, device resource information is cleared after the device resource has been accessed. As described herein, after the access to the device resource (e.g., port or memory location), device resource information is cleared from the systems determining, synchronizing, and transmitting device resource information.

Thus, embodiments of the present invention eliminate the restrictions on pulse width without fast clocks for synchronizing device access information between independent time domains. Thus, a substantial improvement in design and performance of time independent domain devices is achieved.

Embodiments of the present invention are thus described. While the present invention has been described in particular embodiments, it should be appreciated that the present invention should not be construed as limited by such embodiments, but rather construed according to the below claims.

What is claimed is:

1. A circuit, comprising
first logic coupled to receive request signals generated in a first time domain, and configured to store selected of the request signals responsive to a strobe signal of the request signals;
synchronizing logic configured to synchronize the stored request signals to a second time domain to generate synchronized request signals; and
load logic coupled to output the synchronized request signals according to a predetermined priority.

2. The circuit of claim 1, wherein: each of the selected of the request signals corresponds to different resource accessed in response to the load logic.

3. The circuit of claim 1, wherein: the selected of the request signals are predetermined address values for at least one memory device.

4. The circuit of claim 3, wherein: the other of the request signals includes a read/write signal for the at least one memory device.

5. The circuit of claim 1, wherein: the selected of the request signals are port identification values of a multi-port memory system.

6. The circuit of claim 1, wherein: the first logic comprises a plurality of trigger flip-flops (FFs), each trigger FF having an input coupled to receive one of the selected of the request signals, an output coupled to the synchronizing logic, and an enable input coupled to the other of the request signals.

7. The circuit of claim 6, wherein: the synchronizing logic comprises a plurality of flip-flop (FF) chains, each FF chain having multiple FF in series with one another operating in the second time domain, and a chain input coupled to an output of each trigger FF.

8. The circuit of claim 1, further including: clear logic configured to remove one of the synchronized request signal after the synchronized request signal has been output by the load logic.

9. A method, comprising:
receiving a plurality of input signals;
capturing a state of selected input signals responsive to a timing signal of the plurality of input signals;
synchronously clocking the captured states along separate logic paths; and
outputting the captured states according to a predetermined priority.

10. The method of claim 9, wherein: receiving the plurality of input signals includes receiving memory access requests.

11. The method of claim 10, wherein: capturing the state of selected input signals includes any selected from: capturing address values and capturing input signals generated in response to address values.

12. The method of claim 10, wherein capturing a state of selected input signals responsive to the timing signal of the input signals includes capturing selected input signals in response to a rising or falling edge of a read or write request signal.

13. The method of claim 10, wherein: the captured states include both an active state and an inactive state; and outputting the captured states according to a predetermined priority includes providing only one active captured state at one time.

14. The method of claim 9, further including: each captured state corresponds to a different resource; and clearing the captured state in response to an indication that the corresponding resource has been accessed.

15. The method of claim 9, further including: each captured state corresponds to a different resource; and clearing the captured state in response to an indication that the corresponding resource has been accessed.

16. A system, comprising:
a first device;
a second device having a plurality of different resources accessible by the first device, and operating in a first clock domain; and
a logic unit coupled between the first and second devices configured to latch resource request signals from the first device in response to a timing signal of the resource request signals, and synchronize latched resource request signals to the first clock domain.

17. The system of claim 16, wherein: the first device comprises a processor.

18. The system of claim 16, wherein: the second device comprises a memory device; the resource request input signals identify different ports of the memory device; and the timing signal is a read or write request signal.

19. The system of claim 18, further including: at least one buffer configured to transfer data corresponding to different port between the first and second devices in response to at least the latched request signals.

20. The system of claim 16, wherein: the logic unit further includes clear logic configured to remove the latched resource request signal for a resource after the first device has accessed the resource in response to such a resource request signal.

* * * * *